United States Patent
Tanaka et al.

(10) Patent No.: US 7,958,899 B2
(45) Date of Patent: Jun. 14, 2011

(54) SUBSTRATE CLEANING APPARATUS AND SUBSTRATE CLEANING METHOD

(75) Inventors: Takayoshi Tanaka, Kyoto (JP); Masahiro Miyagi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 336 days.

(21) Appl. No.: 12/195,521

(22) Filed: Aug. 21, 2008

(65) Prior Publication Data
US 2009/0050175 A1 Feb. 26, 2009

(30) Foreign Application Priority Data

Aug. 21, 2007 (JP) .............................. 2007-214533
Feb. 22, 2008 (JP) .............................. 2008-041701
Jun. 2, 2008 (JP) .............................. 2008-144107

(51) Int. Cl.
*B08B 3/02* (2006.01)
(52) U.S. Cl. .................. 134/157; 134/186; 134/902
(58) Field of Classification Search .................. 134/157, 134/186, 902
See application file for complete search history.

(56) References Cited

U.S. PATENT DOCUMENTS

| | | | | |
|---|---|---|---|---|
| 6,021,789 A * | 2/2000 | Akatsu et al. | .................. | 134/57 R |
| 6,039,059 A | 3/2000 | Bran | | |
| 6,140,744 A | 10/2000 | Bran | | |
| 6,295,999 B1 | 10/2001 | Bran | | |
| 6,431,184 B1 * | 8/2002 | Taniyama | ...................... | 134/1.3 |
| 6,463,938 B2 | 10/2002 | Bran | | |
| 6,669,809 B2 * | 12/2003 | Hashimoto et al. | ........ | 156/345.2 |
| 6,681,782 B2 | 1/2004 | Bran | | |
| 6,684,891 B2 | 2/2004 | Bran | | |
| 6,699,330 B1 * | 3/2004 | Muraoka | ........................... | 134/3 |
| 6,791,242 B2 * | 9/2004 | Beck et al. | ..................... | 310/367 |
| 6,864,187 B2 * | 3/2005 | Tomimori et al. | ............ | 438/745 |
| 6,983,755 B2 * | 1/2006 | Nam et al. | .................... | 134/147 |
| 7,117,876 B2 | 10/2006 | Bran | | |
| 7,211,932 B2 | 5/2007 | Bran | | |
| 7,268,469 B2 | 9/2007 | Bran | | |
| 2002/0011256 A1 | 1/2002 | Bran | | |
| 2003/0010357 A1 | 1/2003 | Bran | | |
| 2003/0015218 A1 | 1/2003 | Bran | | |

(Continued)

FOREIGN PATENT DOCUMENTS

JP 07-066164 * 3/1995

(Continued)

OTHER PUBLICATIONS

European Patent Office 1 179 618 Feb. 2002.*

(Continued)

*Primary Examiner* — Frankie L Stinson
(74) *Attorney, Agent, or Firm* — Ostrolenk Faber LLP

(57) ABSTRACT

At a vibration applying position, ultrasonic vibration is applied upon a liquid film which is on a surface of a substrate. Concurrently with this, at a drop arrival position which is different from the vibration applying position, drops of a cleaning liquid are supplied to the liquid film, whereby wave-generating vibration which is different from the ultrasonic vibration is applied upon the liquid film. This dramatically improves removal of particles adhering to the surface of the substrate as compared with mere application of ultrasonic vibration. Hence, even when the output, the frequency and the like of the ultrasonic vibration are set to such an extent not damaging the substrate, it is possible to effectively remove particles with the wave-generating vibration and favorably clean the surface of the substrate.

16 Claims, 12 Drawing Sheets

U.S. PATENT DOCUMENTS

| | | |
|---|---|---|
| 2004/0206371 A1 | 10/2004 | Bran |
| 2006/0021636 A1 | 2/2006 | Miya |
| 2006/0175935 A1 | 8/2006 | Bran |
| 2006/0180186 A1 | 8/2006 | Bran |
| 2006/0272685 A1 | 12/2006 | Honda et al. |
| 2008/0006292 A1 | 1/2008 | Bran |

FOREIGN PATENT DOCUMENTS

| | | | |
|---|---|---|---|
| JP | 09-260277 | * | 10/1997 |
| JP | 11-244796 | | 9/1999 |
| JP | 2000-210629 | * | 8/2000 |
| JP | 2001-87725 | | 4/2001 |
| JP | 2003-318148 | * | 11/2003 |
| JP | 2003-318154 | | 11/2003 |
| JP | 3493492 | | 2/2004 |
| JP | 2005-085978 | * | 3/2005 |
| JP | 2006-41444 | | 2/2006 |
| JP | 2006-326486 | | 12/2006 |
| JP | 2007-027241 | * | 2/2007 |
| JP | 2008-144107 | | 6/2008 |
| KR | 10-0464118 | | 6/2005 |

OTHER PUBLICATIONS

Office Action issued May 28, 2010 in connection with corresponding Korean Patent Application No. 2008-74961.

* cited by examiner

FIG. 2

◆ SUPPLYING CONDITIONS (FLOW RATE OF DIW, NOZZLE HEIGHT)

|  |  | FLOW RATE OF DIW | | |
|---|---|---|---|---|
|  |  | 50 (mL/min) | 100 (mL/min) | 200 (mL/min) |
| NOZZLE HEIGHT H | 7mm | WAFER W1 | WAFER W2 | WAFER W3 |
|  | 12mm | WAFER W4 | WAFER W5 | WAFER W6 |
|  | 28mm | WAFER W7 | WAFER W8 | WAFER W9 |

FIG. 3A : CONDITION OF DIW ARRIVED AT LIQUID FILM: DIW HAS SHAPE OF ROD
FIG. 3B : CONDITION OF DIW ARRIVED AT LIQUID FILM: DIW HAS SHAPE OF DROP

F I G. 1 4
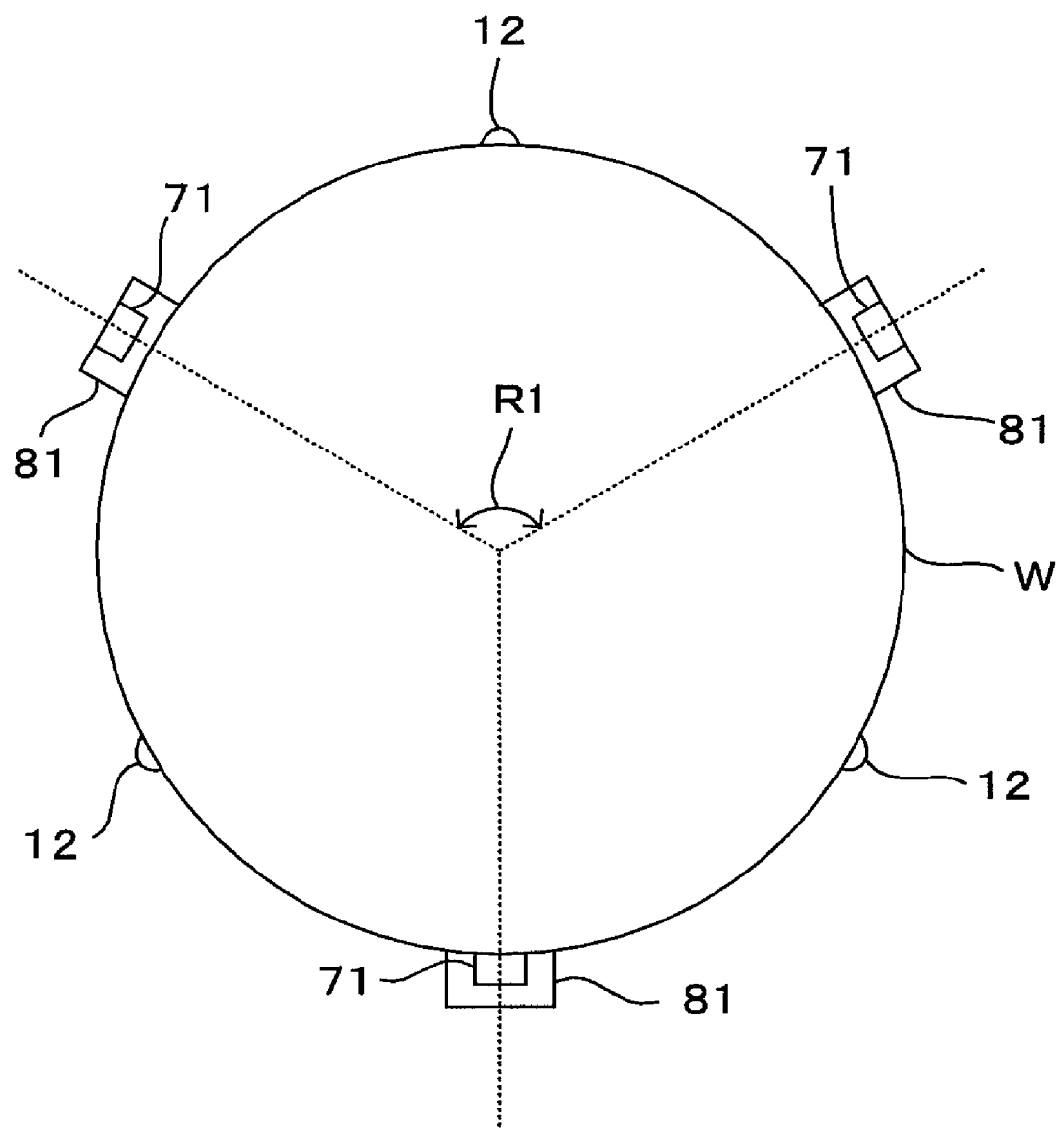

SUBSTRATE CLEANING APPARATUS AND SUBSTRATE CLEANING METHOD

CROSS REFERENCE TO RELATED APPLICATION

The disclosure of Japanese Patent Applications enumerated below including specification, drawings and claims is incorporated herein by reference in its entirety:
No. 2007-214533 filed Aug. 21, 2007;
No. 2008-41701 filed Feb. 22, 2008; and
No. 2008-144107 filed Jun. 2, 2008.

BACKGROUND OF THE INVENTION

1. Field of the Invention

The present invention relates to a substrate processing apparatus for and a substrate processing method of supplying a processing liquid to surface peripheral sections of substrates, such as semiconductor wafers, glass substrates for photomask, glass substrates for liquid crystal display, substrates for plasma display, substrates for FED (field emission display), substrates for optical disk, substrates for magnetic disk and substrates for magnet-optical disk, to thereby perform a surface treatment of the surface peripheral sections of the substrates.

2. Description of the Related Art

In a manufacturing process which is a series of treatments of substrates such as semiconductor wafers, film deposition steps are executed to form various types of thin films on the front surfaces of the substrates. Film deposition steps sometimes result in films on the back surfaces of the substrates or peripheral sections in the front surfaces of the substrates. However, it is generally circuit forming areas alone at the center of the front surfaces of the substrates that need film deposition on the substrates, and film deposition if any on the back surfaces of the substrates or in the peripheral sections of the front surfaces of the substrates may give rise to the following problem. That is, a thin film formed in a peripheral section of the front surface of a substrate may get stripped off due to its contact with other apparatus at a later step following a film deposition step. A thin film thus stripped off may adhere to a circuit forming area at the center of the front surface of the substrate or to a substrate processing apparatus, leading to a lowered yield for manufacturing of products or a trouble with the substrate processing apparatus itself.

For removal of a thin film formed on the back surface of a substrate or in a peripheral section of the front surface of the substrate therefore, the apparatus according to JP-A-2006-41444 has been proposed for instance. In this apparatus, a support part is disposed projecting toward above from a spin base such that it supports a substrate while abutting on a peripheral section of the back surface of the substrate, and the support part horizontally holds the substrate whose front surface is directed toward above and on the front surface of which a thin film is formed. From an atmosphere blocking plate (which corresponds to the "opposed member" of the invention) disposed above the substrate, inert gas is fed to a space which is defined between the substrate and the atmosphere blocking plate, whereby the substrate is pressed against the support part and rotated while held at the spin base. Further, with a nozzle inserted in a nozzle insertion hole which is bored in a peripheral section of the atmosphere blocking plate, a chemical solution is supplied as a processing liquid from the nozzle toward the peripheral section of the front surface of the substrate which is rotating. As a result, the unwanted substance adhering to the peripheral section of the front surface of the substrate is etched and removed. In addition, a chemical solution is supplied as a processing liquid toward the back surface of the substrate which is rotating. The chemical solution spreads all over the back surface of the substrate, whereby the unwanted substance adhering to the back surface of the substrate is etched and removed. In this manner, the thin film is etched and removed only on the back surface of the substrate and in the peripheral section of the front surface of the substrate.

A manufacturing process of an electronic component such as a semiconductor device and a liquid crystal display device includes a process to form fine patterns by performing processes such as film deposition and etching on a substrate surface. It is necessary to keep the substrate surface clean in order to perform fine processing favorably. Hence, a cleaning process is performed to the substrate surface as needed. Consequently, a cleaning liquid is supplied to the substrate and ultrasonic vibration is provided to the cleaning liquid to remove particles adhering to the substrate. In this way, the particles are effectively separated and removed from the substrate by the ultrasonic vibrating energy which the cleaning liquid has.

As such a substrate cleaning apparatus, the following systems have been proposed. For example, an apparatus disclosed in JP-A-11-244796 cleans the substrate surface by discharging a cleaning liquid, to which the ultrasonic vibration is provided, from a nozzle toward the substrate surface. Further, apparatuses disclosed in Japanese Patent No. 3493492 and JP-A-2001-87725 form a liquid film of the cleaning liquid on the substrate surface and the ultrasonic vibration is provided to the liquid film to clean the substrate surface. Furthermore, in an apparatus disclosed in JP-A-2006-326486, an ultrasonic transducer is disposed facing the substrate surface and a cleaning liquid flows in the gap therebetween to clean the substrate surface.

SUMMARY OF THE INVENTION

According to the cleaning method above, an ultrasonic wave applier (such as a rod-like horn, a probe and an ultrasonic wave applying head) which provides ultrasonic vibration is disposed opposed to the front surface of the substrate and removes particles by its ultrasonic vibration at this opposed position. For improvement of the particle removal ratio therefore, an increased ultrasonic vibration output or a lowered frequency would be effective. However, a higher output is likely to damage a pattern or the like formed on the substrate at the opposed position. Further, the cleaning method above demands that the ultrasonic wave applier moves relative to the front surface of the substrate so as to clean the whole front surface of the substrate. Damage if any would therefore affect the entire front surface of the substrate. On the contrary, a lowered ultrasonic vibration output or a higher frequency would remarkably deteriorate the particle removal ratio although suppressing damage. The cleaning method of related art thus utilizes merely ultrasonic vibration for particle removal. Hence, it is difficult to attain suppression of damage upon the substrate and removal of particles at the same time.

The invention has been made in light of the problem described above. An advantage of the invention is to provide a substrate cleaning apparatus and a substrate cleaning method which make it possible to efficiently remove particles on the front surface of a substrate while discouraging damage upon the substrate.

Another advantage of the invention is to uniformly remove particles on the front surface of a substrate.

According to a first aspect of the invention, there is provided a substrate cleaning apparatus, comprising: an ultrasonic wave applier which applies ultrasonic vibration upon a liquid film at a first position, the liquid film being made of a first cleaning liquid and covering a surface of a substrate; a supplier which supplies a second cleaning liquid to the liquid film at a second position which is on a path on which the ultrasonic vibration propagates within the liquid film toward the surface of the substrate and different from the first position; and a controller which causes the supplier to supply the second cleaning liquid to the liquid film to apply additional vibration different from the ultrasonic vibration upon the liquid film while activating the ultrasonic wave applier to apply the ultrasonic vibration upon the liquid film.

According to a second aspect of the invention, there is provided a substrate cleaning apparatus, comprising: an introducing unit which is disposed in the vicinity of a peripheral edge section of the substrate on a surface of which a substrate-side liquid film segment of a first cleaning liquid is formed, and forms an outer-side liquid film segment which is contiguous to the substrate-side liquid film segment with the first cleaning liquid introduced from the substrate-side liquid film segment to the outer side of the substrate; an ultrasonic wave applier which applies ultrasonic vibration upon the outer-side liquid film segment; a supplier which supplies a second cleaning liquid to the outer-side liquid film segment at a position closer to the substrate than a position at which the ultrasonic vibration is applied; and a controller which causes the supplier to supply the second cleaning liquid to the outer-side liquid film segment to apply additional vibration different from the ultrasonic vibration upon the outer-side liquid film segment while activating the ultrasonic wave applier to apply the ultrasonic vibration upon the outer-side liquid film segment.

According to a third aspect of the invention, there is provided a substrate cleaning method, comprising: a first step of making an ultrasonic transducer contact with a liquid film at a first position, the liquid film being made of a first cleaning liquid and covering a surface of a substrate; and a second step of supplying a second cleaning liquid to the liquid film at a second position which is different from the first position and accordingly applying additional vibration which is different from the ultrasonic vibration upon the liquid film while activating the ultrasonic transducer to apply the ultrasonic vibration upon the liquid film.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 2 shows supplying conditions for the respective wafers.

FIG. 3A shows that DIW fed to the liquid film has a shape of a rod which is an uninterrupted flow.

FIG. 3B shows that DIW supplied to the liquid film is in a shape of drops, that is, an intermittent and broken flow.

FIG. 14 is a diagram showing an embodiment which has three ultrasonic wave applying heads.

DETAILED DESCRIPTION OF THE PREFERRED EMBODIMENTS

An apparatus of a related art applies ultrasonic vibration to a liquid film of a cleaning liquid which is formed on the front surface of a substrate, thereby separating particles from the front surface of the substrate and removing the particles. In an attempt to improve ultrasonic cleaning techniques, the inventors supplied a cleaning liquid under various conditions to the liquid film to which ultrasonic vibration is applied, and verified changes of the particle removal ratio due to the different supplying conditions. From the verification result, the inventor obtained findings that the particle removal ratio improves when wave-generating vibration is additionally applied to the liquid film by supplying a cleaning liquid to the liquid film to which ultrasonic vibration is applied. Based on the findings, the inventors developed a concept of a substrate cleaning apparatus and a substrate cleaning method which combine ultrasonic vibration with wave-generating vibration. After description of the inventors' findings, namely, "improvement of the particle removal ratio owing to additional vibration", embodiments utilizing the findings will then be described in detail.

<Improvement of Particle Removal Ratio Owing to Additional Vibration>

The inventors conducted the following experiment. Nine silicon wafers (having the diameter of 200 mm) were prepared, and a single-wafer type substrate processing apparatus (spin processor SS-3000 manufactured by Dainippon Screen Mfg. Co., Ltd.) forcibly contaminated the wafers (substrates) W1 through W9. More specifically, while rotating each wafer, a dispersion liquid in which particles (of silicon) were dispersed was supplied to the front surface of the wafer. In the experiment, the amount of the dispersion liquid, the revolution speed of the wafer and the processing time were appropriately adjusted so that the number of particles adhering to the front surface of the wafer would be 10000 approximately. The number (initial count) of particles (having the particle diameters of 0.08 µm or larger) adhering to the front surface of the wafer was then measured. The particle count was measured using a particle evaluation apparatus SP1-TBI manufactured by KLA-Tencor.

Figure 1A:
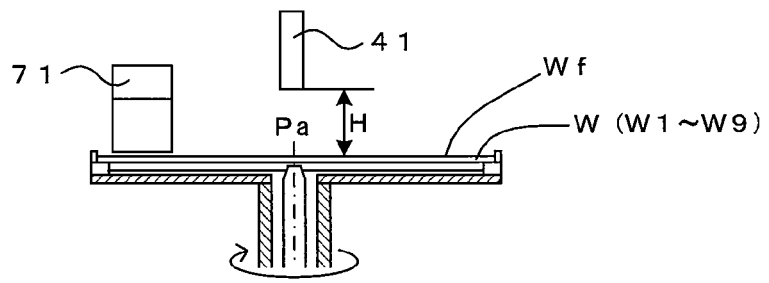
FIGS. 1A, 1B, 1C schematically illustrate an experiment conducted by the inventors.
Figure 1B:
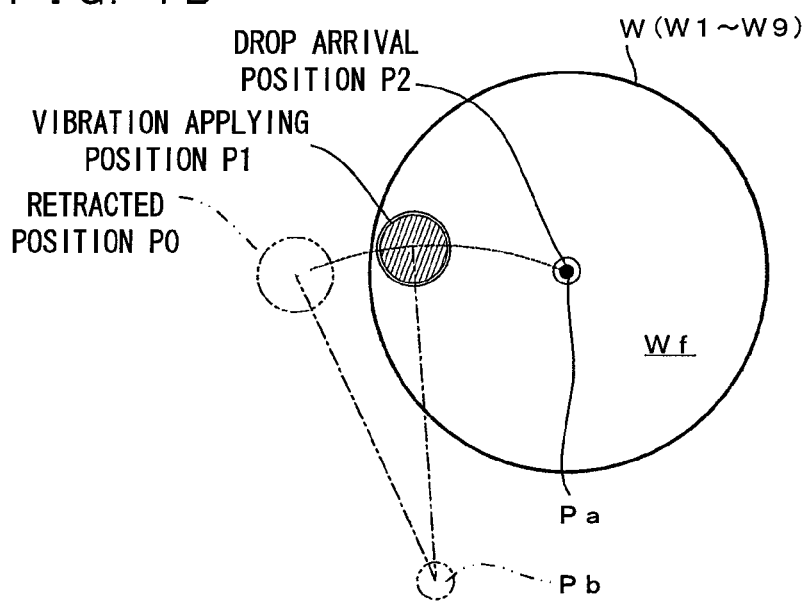

Following this, using an apparatus whose structure is schematically shown in FIG. 1A, a liquid film of DIW (deionized water) was formed on the front surface Wf of the wafer W. That is, while rotating the wafers W1 through W9 horizontally at 100 rpm with the front surfaces Wf of the wafers directed toward above, a nozzle 41 disposed at nozzle height H above the wafer surfaces Wf supplied DIW to the wafer surfaces Wf at a flow rate of 300 (mL/min). DIW films of 2 through 3 mm were consequently formed on the wafer surfaces Wf. With an ultrasonic wave applying head 71 positioned at a vibration applying position P1 in peripheral sections of the front surfaces of the wafers as shown in FIG. 1B and applying ultrasonic vibration, DIW was supplied to the rotation center of wafer (position P2) while changing the supplying conditions (the flow rate of DIW and the nozzle height H) among the wafers W1 through W9, and the wafer surfaces Wf were cleaned. More specifically, the oscillation output of the ultrasonic vibration was set to 5 W and the oscillating frequency was set to 3 MHz with the ultrasonic wave applying head 71 fixed at the vibration applying position P1, and the supplying conditions for the respective wafers W1 through W9 were set as shown in FIG. 2. To observe how DIW discharged from the nozzle 41 under the respective supplying conditions arrived at the liquid films, the DIW supplied to the liquid films was taken as an image using an imaging device such as a digital camera.

Spin drying followed the wafer cleaning, and the number of particles adhering to the front surfaces of the wafers was measured with the particle evaluation apparatus mentioned above. The particle count after the cleaning was then compared with the particle count (initial count) before the cleaning, and the particle removal ratio as for the entire wafer surface and that as for an evaluation area (which is a hatched part in FIG. 1C) were calculated.

While the conditions for supplying DIW changed in the experiment above, depending upon the supplying conditions, DIW was supplied in the shape of a rod (column of fluid) in some instances and as drops in other instances. That is, under the supplying conditions for the wafers W2, W3 and W6 among the wafers W1 through W9, DIW fed to the liquid films from the nozzle 41 has the shape of a rod which is an uninterrupted flow as shown in FIG. 3A. DIW as it is almost still without ripples at the surface of the liquid film is supplied to the rotation center of wafer (position P2). On the other hand, under the supplying conditions for the wafers W1, W2, W4, W5 and W7 to W9 among the wafers W1 through W9, DIW supplied to the liquid film from the nozzle 41 is in a shape of drops, that is, an intermittent and broken flow as shown in FIG. 3B. The surface of the liquid film ruffles, that is, water wave is generated on the surface of the liquid film by the DIW which has fallen in a shape of drops.

Figure 1C:
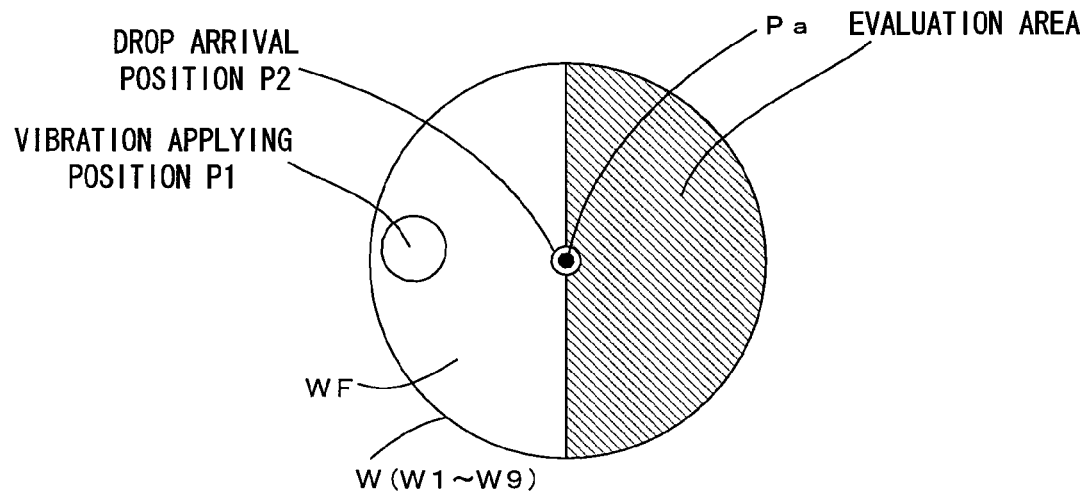
Figure 4:
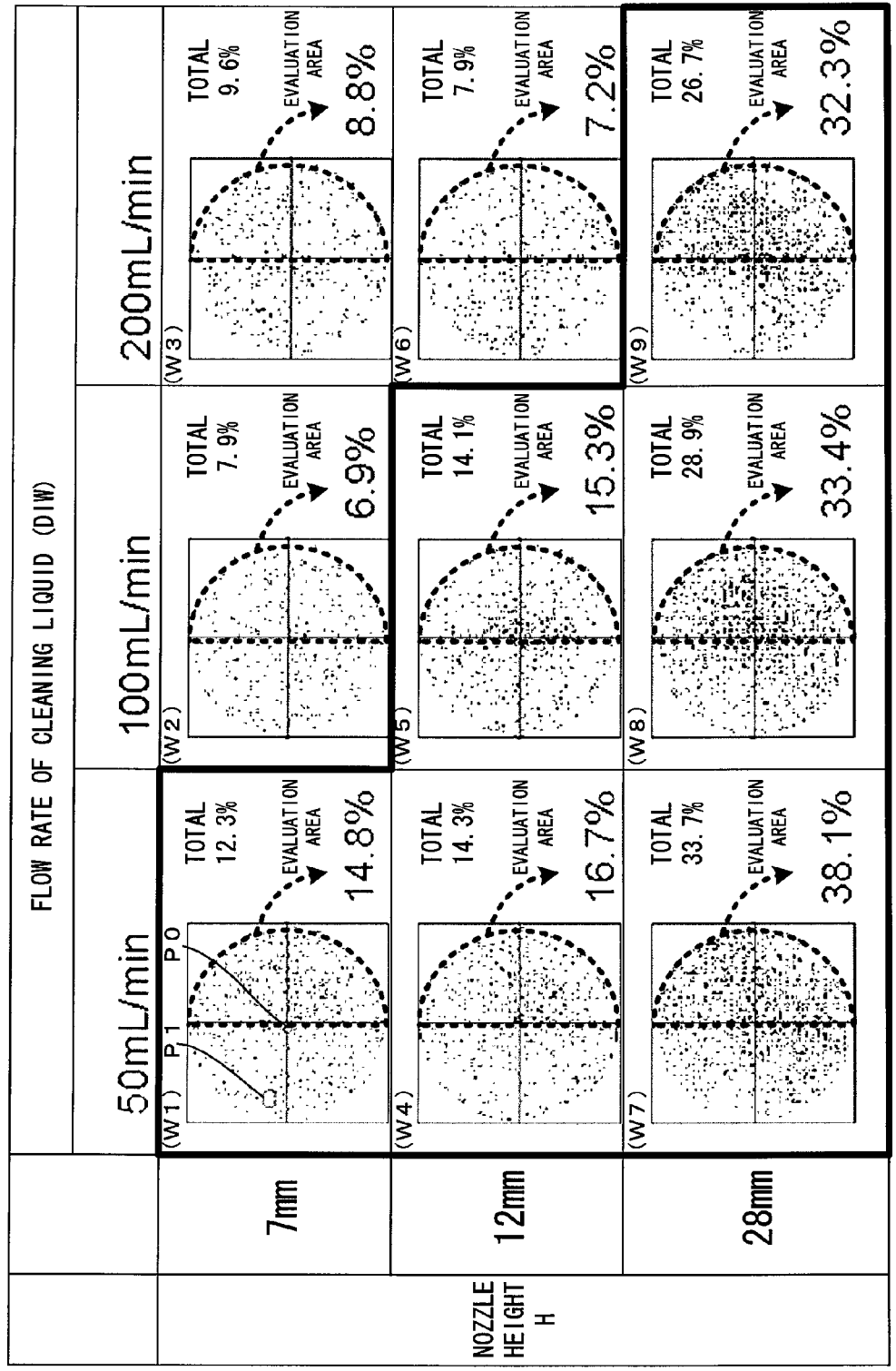
FIG. 4 shows how particles were removed from the wafers.

FIG. 4 shows how particles were removed from the wafers W1 through W9 thus cleaned under these supplying conditions. The black dots in FIG. 4 denote positions at which particles were removed. Hence, it is possible to calculate the particle removal ratio from the number of the black dots and to calculate unevenness of the cleaning effect from the distribution of the black dots. Here, the particle removal ratio was calculated separately for the entire wafer surface and for the evaluation area. The descriptions "TOTAL n %" in FIG. 4 indicate the particle removal ratio in the entire wafer surface, while the numerical figures for the dotted semicircle enclosures indicate the particle removal ratio in the evaluation area. The evaluation area is an area located on the opposite side of the drop arrival position P2 within the wafer surface from the vibration applying position P1 as shown in FIGS. 1C and 4.

From the experimental result above, one can tell that addition of drops of a cleaning liquid (DIW) to a liquid film to which ultrasonic vibration is being applied is very useful in improving the particle removal ratio. This is closely related to addition of wave-generating vibration to the surface of a liquid film achieved by supply of drops to thereby generate water wave on the surface thereof. One can further see from the distribution of particle removal that the cleaning effect is uneven. An area where the particle removal ratio can be improved due to application of wave-generating vibration, namely, an area of excellent removal is uneven instead of being all over the wafer surface. That is, the area of excellent removal changes depending upon the relative positional relationship of the vibration applying position P1 relative to the drop arrival position P2. More specifically, ultrasonic vibration applied to the liquid film at the vibration applying position P1 propagates within the liquid film toward the wafer surface Wf. In the above experiment for example, since the vibration applying position P1 is in a far-left peripheral section of the wafer surface Wf as shown in FIG. 1, the ultrasonic vibration propagates from the far-left peripheral section side toward the far-right side of the wafer W. And wave-generating vibration is applied on this propagation path. A wafer surface area which is on the opposite side of the drop arrival position P2 at which the wave-generating vibration is applied from the vibration applying position P1 becomes the area of excellent removal. Hence, the area of excellent removal can be controlled by adjusting this relative positional relationship. When the drop arrival position P2 is set at the rotation center of the wafer W and the wafer W is rotated during cleaning in particular, the area of excellent removal moves with the rotation of the wafer. Hence, when the wafer W rotates one round or more, particles are removed uniformly and favorably from the entire wafer surface. The vibration applying position P1 thus corresponds to the "first position" of the invention and the drop arrival position P2 thus corresponds to the "second position" of the invention. Further, the wave-generating vibration corresponds to the "additional vibration" of the invention.

Figure 5A:
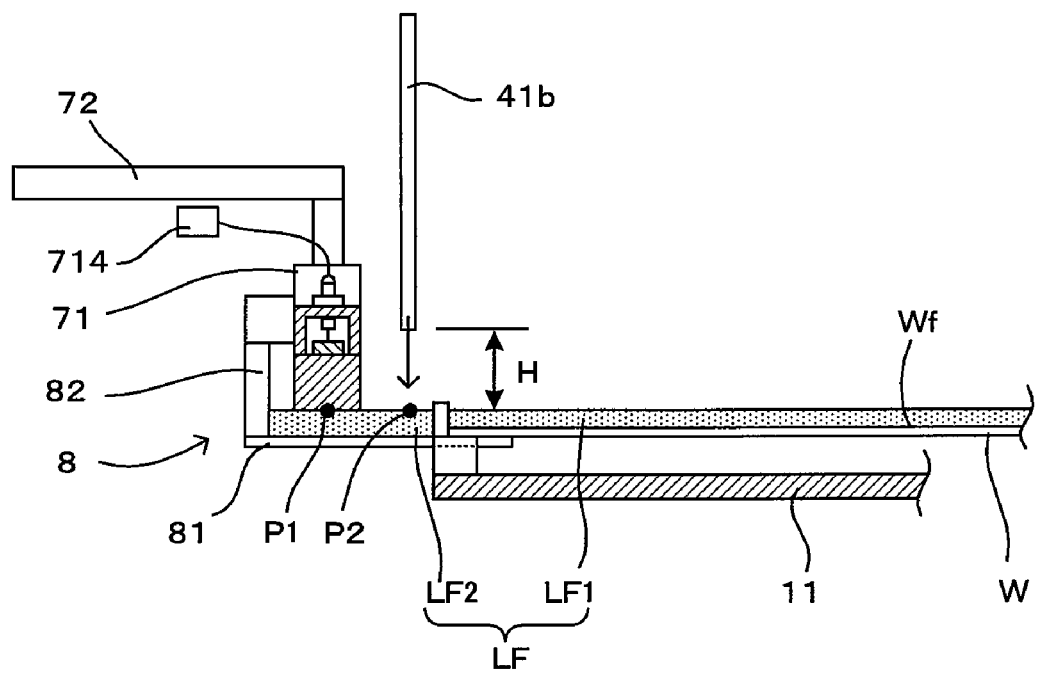
FIGS. 5A and 5B is a diagram showing a relationship between a vibration applying position and a drop arrival position in a second embodiment.
Figure 5B:
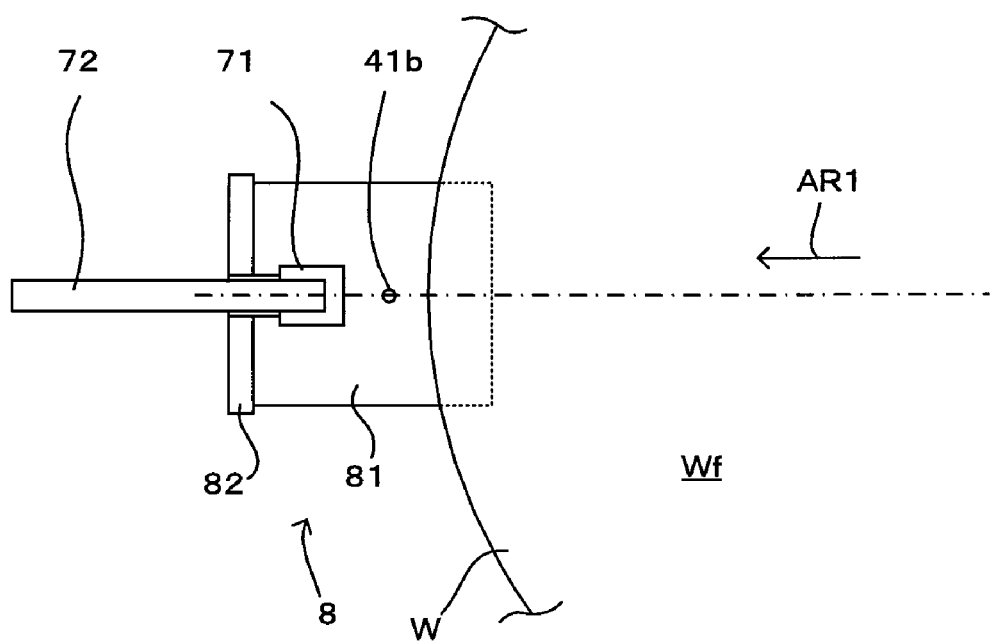
Figure 6A:
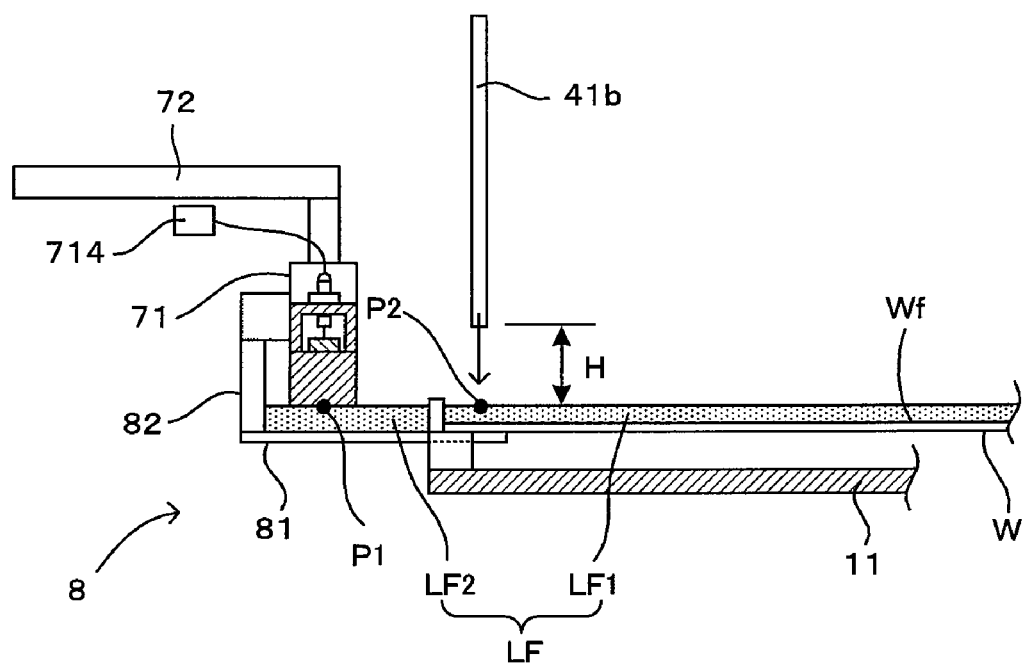
FIGS. 6A and 6B is a diagram showing a relationship between a vibration applying position and a drop arrival position in a third embodiment.
Figure 6B:
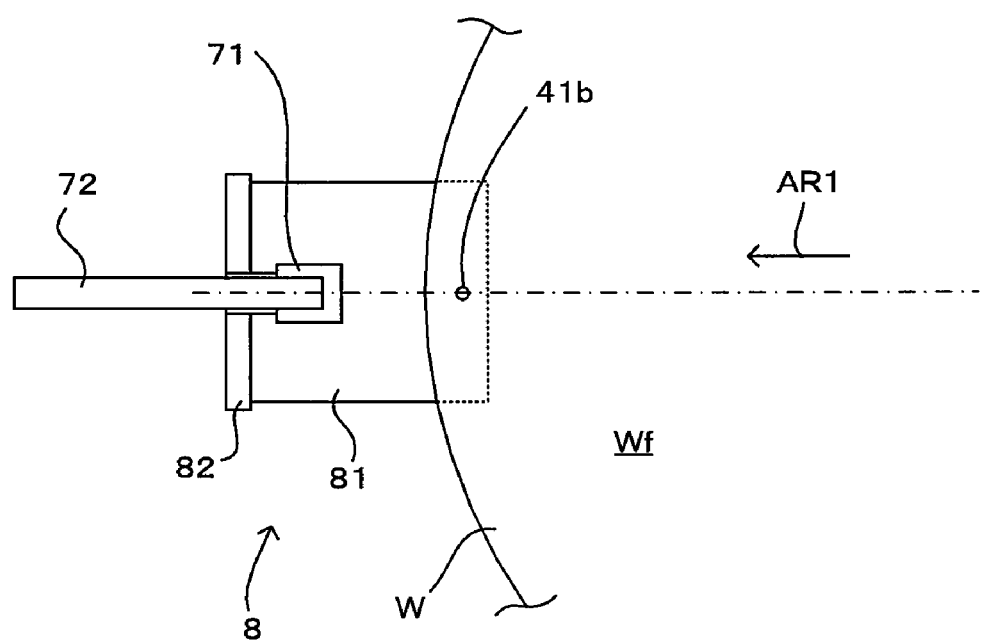

Further, ultrasonic vibration and wave-generating vibration are applied to a liquid film formed on the wafer surface Wf (corresponding to the "substrate-side liquid film segment" of the invention) in the experiment above. However, a similar experimental result to the result above is obtained even when the positions at which ultrasonic vibration and wave-generating vibration are applied are changed as described in detail later in relation to a second and a third embodiments. For example, where an apparatus according to the second or the third embodiment is used, it is possible to form a liquid film LF which includes a substrate-side liquid film segment LF1 formed on the wafer surface Wf and an outer-side liquid film segment (corresponding to the "outer-side liquid film segment" of the invention) LF2 formed extending beyond the periphery of the wafer surface as shown in FIGS. 5A, 5B, 6A and 6B. When a liquid film LF which includes a substrate-side liquid film segment LF1 and an outer-side liquid film segment LF2 covers a wafer surface Wf from above like this, it is possible to apply ultrasonic vibration to the outer-side liquid film segment LF2, and the ultrasonic vibration mostly propagates toward the wafer surface Wf. By applying wave-generating vibration to a position on this propagation path, it was possible to favorably remove particles adhering to a wafer surface area located on the opposite side of the drop arrival position P2 at which the wave-generating vibration is applied from the vibration applying position P1, which is similar to the experimental result above. As shown in FIGS. 5A and 5B for example, when wave-generating vibration is applied to the outer-side liquid film segment LF2 so that the vibration applying position P1 would be on the opposite side of the drop arrival position P2 in the outer-side liquid film segment LF2 from the substrate-side liquid film segment LF1 (the left-hand side in FIGS. 5A and 5B), the entire wafer surface Wf comes to be positioned on the opposite side of the drop arrival position P2 from the vibration applying position P1 and becomes an area of excellent removal. Further, as shown in FIGS. 6A and 6B for instance, ultrasonic vibration is applied to the outer-side liquid film segment LF2 and propagates from the far-left end of the wafer surface Wf to the entire wafer surface Wf. In this condition, when wave-generating vibration is applied to a freely chosen position in the substrate-side liquid film segment LF1, a wafer surface area located on the opposite side of the drop arrival position P2 at which the wave-generating vibration is applied from the vibration applying position P1 becomes an area of excellent removal.

First Embodiment

Figure 7:
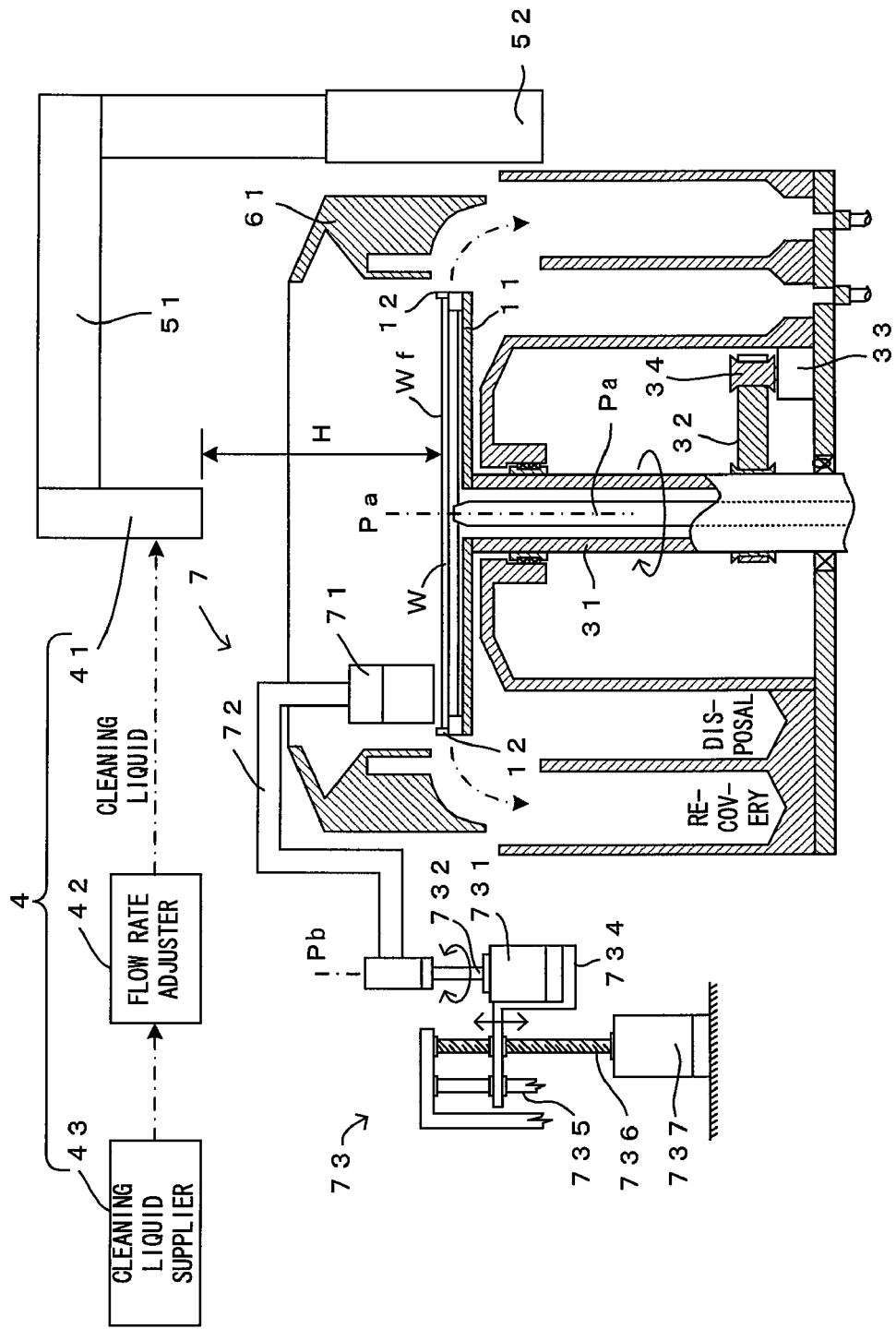
FIG. 7 is a diagram showing a first embodiment of a substrate cleaning apparatus according to the invention.
Figure 8:
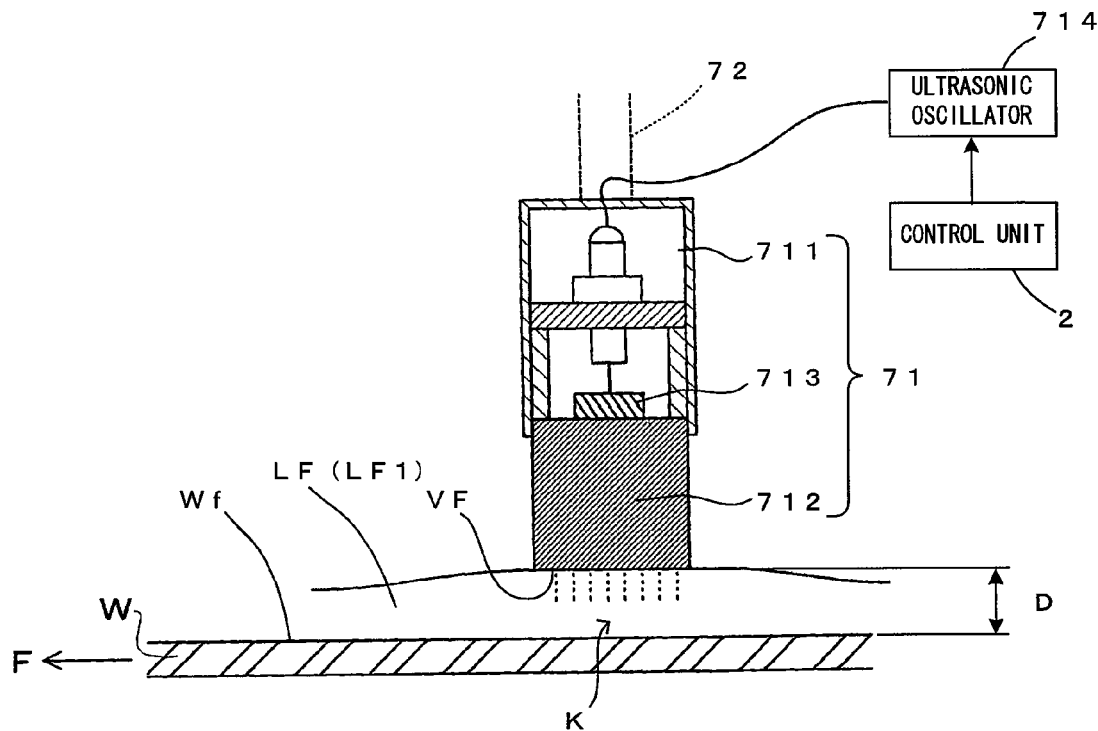
FIG. 8 is a cross sectional view which shows a structure of an ultrasonic wave applying head used in the substrate cleaning apparatus which is shown in FIG. 7.
Figure 9:
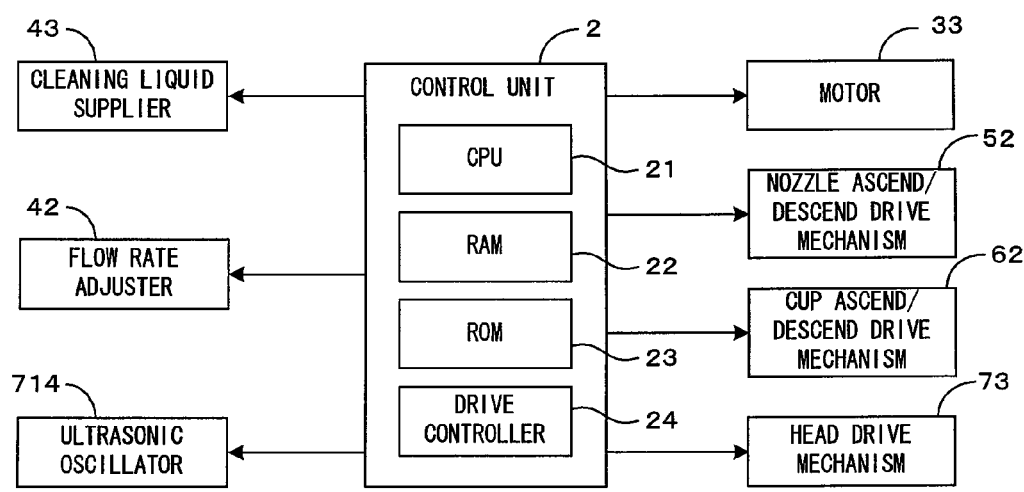
FIG. 9 is a block diagram which shows an electric structure of the substrate cleaning apparatus which is shown in FIG. 7.

FIG. 7 is a diagram showing a first embodiment of a substrate cleaning apparatus according to the invention. FIG. 8 is a cross sectional view which shows a structure of an ultrasonic wave applying head used in the substrate cleaning apparatus which is shown in FIG. 7. FIG. 9 is a block diagram which shows an electric structure of the substrate cleaning apparatus which is shown in FIG. 7. This substrate cleaning apparatus is a single-wafer type substrate cleaning apparatus used for a cleaning processing which aims at removal of contaminants such as particles adhering to a front surface Wf of a substrate W which may be a semiconductor wafer, etc. More specifically, this is an apparatus which cleans the substrate W with application of ultrasonic vibration and wave-generating vibration to a liquid film after forming the liquid film of a cleaning liquid with supply of a processing liquid such as DIW as a cleaning liquid to the substrate surface Wf on which a device pattern is formed. In this embodiment, the same type of processing liquids are used as a first cleaning liquid and a second cleaning liquid.

This substrate cleaning apparatus comprises a spin base 11 whose plane size is slightly larger than the substrate W. Multiple support pins 12 are disposed on the top surface of the spin base 11 at the periphery. As the support pins 12 abut on the end of the substrate W, the substrate W is supported approximately horizontally with its front surface Wf directed toward above. The structure for holding the substrate is not limited to this. The substrate W may be held by a suction method such as a spin chuck for example.

As shown in FIG. 7, a rotation shaft 31 is linked to the spin base 11. The rotation shaft 31 is linked to an output rotation shaft 34 of a motor 33 via a belt 32. The motor 33 operates based on a control signal from a control unit 2, and the rotation shaft 31 rotates as the motor drives. As a result, the substrate W held by the support pins 12 above the spin base 11 rotates about the rotation center Pa together with the spin base 11. According to this embodiment, the rotation shaft 31, the belt 32 and the motor 33 thus form the "substrate rotating device" of the invention which realizes driving and rotating the substrate W.

A supply unit 4 is disposed to supply the cleaning liquid to the front surface Wf of the substrate W which is rotated in this fashion. In the supply unit 4, a nozzle 41 is disposed on the rotation center Pa above the spin base 11. A cleaning liquid supplier 43 is connected with the nozzle 41 via a flow rate adjuster 42, which makes it possible to supply the cleaning liquid to the center of rotation within the substrate surface Wf. In this embodiment, the center of rotation coincides with the drop arrival position (second position) P2 within the substrate surface Wf. The flow rate adjuster 42 operates in accordance with a control signal from the control unit 2 while the cleaning liquid supplier 43 is active, whereby the supply of the cleaning liquid to the nozzle 41 from the cleaning liquid supplier 43 is adjusted. That is, the flow rate adjuster 42 has a function of supplying the cleaning liquid to the nozzle 41, stopping the supply and adjusting the flow rate for supplying the cleaning liquid. One of principal purposes of adjusting the flow rate of the cleaning liquid is to make the single nozzle 41 selectively execute a liquid film forming operation and a drop supplying operation as described in detail later. Of course, other approach as that according to a second and a third embodiments described later may be chosen which uses two types of nozzles one of which is a liquid film forming nozzle for discharging a first cleaning liquid and forming a liquid film and the other of which is a drop supplying nozzle for discharging a second cleaning liquid and applying wave-generating vibration to the liquid film.

A top end of the nozzle 41 is linked to a nozzle ascend/descend drive mechanism 52 by a horizontal beam 51. When the nozzle ascend/descend drive mechanism 52 operates in accordance with a control signal from the control unit 2, the nozzle 41 moves up or down together with the horizontal beam 51 as one integrated unit. Hence, when the control unit 2 provides the nozzle ascend/descend drive mechanism 52 with a height-position command related to a height of the nozzle 41 measured from the substrate surface Wf, the nozzle 41 moves up or down and gets positioned at a height position which corresponds to the height-position command. Adjustment of the height H from the substrate surface Wf to the tip (outlet) of the nozzle 41 therefore controls whether the cleaning liquid discharged from the nozzle 41 reaches the liquid film as a column of liquid, as drops or otherwise appropriately.

For the purpose of preventing the cleaning liquid discharged from the nozzle 41 from getting splashed, a splashing preventing cup 61 is disposed around the spin base 11. After a cup ascend/descend drive mechanism 62 has moved up the cup 61 in accordance with a control signal received from the control unit 2, the cup 61 surrounds the substrate W which is held by the spin base 11 and the support pins 12 from the side as shown in FIG. 7 and is capable of collecting the cleaning liquid splashing back from the spin base 11 and the substrate W. On the other hand, when a transportation unit not shown is about to mount the substrate W not processed yet onto the support pins 12 on the spin base 11 or to receive the processed substrate W from the support pins 12 or when an ultrasonic wave applying head 71 of an ultrasonic wave applying unit 7 described next is about to move between a vibration applying position and a retracted position, the cup ascend/descend drive mechanism 62 moves the cup 61 toward below in accordance with a control signal from the control unit 2.

FIG. 8 is a cross sectional view which shows the structure of the ultrasonic wave applying head. This ultrasonic wave applying unit 7 comprises the ultrasonic wave applying head 71, an arm member 72 which holds the ultrasonic wave applying head 71, and a head drive mechanism 73 which moves the ultrasonic wave applying head 71.

In the ultrasonic wave applying head 71, a vibration plate 712 is attached to a bottom-surface-side opening of a main part 711 made of a fluororesin such as Teflon tetrafluoride (registered trade mark) which is polytetrafluoroethylene. The vibration plate 712 is shaped like a disk when viewed in a plan view, and its bottom surface is a vibration surface VF. A transducer 713 is bonded to the top surface of the vibration plate 712. In response to outputting of a pulse signal to the transducer 713 from an ultrasonic oscillator 714 in accordance with a control signal from the control unit 2, the transducer 713 starts ultrasonic vibration.

The arm member 72 holds at its one end the ultrasonic wave applying head 71. The head drive mechanism 73 is linked to the other end of the arm member 72. The head drive mechanism 73 comprises a rotation motor 731. A rotation shaft 732 of the rotation motor 731 is linked to the other end of the arm member 72. When the rotation motor 731 operates in accordance with a control signal from the control unit 2, the arm member 72 swings about the rotation center Pb as shown in FIG. 1B, thereby moving the ultrasonic wave applying head 71 reciprocally between the vibration applying position P1 and the retracted position P0. While the vibration applying position P1 may be set freely, in this embodiment, the vibration applying position P1 is set in a peripheral section of the front surface of the substrate W so as to suppress damage attributable to ultrasonic vibration. During the cleaning processing, the ultrasonic wave applying head 71 is fixed at the vibration applying position P1.

An ascend/descend base 734 mounting the rotation motor 731 is fit to a guide 735 which is disposed upright such that the ascend/descend base 734 can freely slide, and engaged with a ball screw 736 which is disposed on the side of the guide 735. The ball screw 736 is linked to and hence works in conjunction with a rotation shaft of an ascend/descend motor 737. Operating in accordance with a control signal from the control unit 2, the ascend/descend motor 737 rotates the ball screw 736 and hence moves the nozzle 41 upward or downward. The head drive mechanism 73 is thus a mechanism which moves the ultrasonic wave applying head 71 upward, downward and reciprocally and accordingly positions the ultrasonic wave applying head 71 at the vibration applying position P1.

When the head drive mechanism 73 has set the ultrasonic wave applying head 71 at the vibration applying position P1, a distance between the vibration surface VF and the substrate surface Wf, namely, a substrate-facing distance D is controlled at a high accuracy by the control of the ascend/descend motor 737. That is, the substrate-facing distance D is equal to or smaller than the film thickness of the liquid film LF of the cleaning liquid as shown in FIG. 8, and a space (gap space K) between the vibration surface VF and the substrate surface Wf is a space to be filled with the cleaning liquid. When the control unit 2 activates the ultrasonic wave applying head 71 in a condition that the vibration surface VF and the substrate surface Wf are in contact with the cleaning liquid, the ultrasonic vibration reaches the liquid film LF and the substrate W.

The control unit 2 which controls the entire apparatus principally comprises a CPU (central processing unit) 21, a RAM (random access memory) 22, a ROM (read only memory) 23 and a drive controller 24. Of these, the ROM 23 is what is known as a non-volatile storage and stores a program for controlling the respective parts of the apparatus. As the CPU 21 controls the respective parts of the apparatus in accordance with the program stored in the ROM 23, the apparatus executes the following substrate cleaning operation.

Operations of the substrate cleaning apparatus having the above structure will now be described. In this substrate cleaning apparatus, the substrate W not processed yet is transported by the transportation unit not shown to above the support pins 12 and then held by the support pins 12. After the transportation unit has moved back from the substrate cleaning apparatus, the CPU 21 of the control unit 2 controls the respective parts of the apparatus, whereby the cleaning operation is performed. At this stage, the ultrasonic wave applying head 71 is positioned at the retracted position P0.

First, the substrate W starts rotating. The nozzle 41 thereafter discharges the cleaning liquid as a column of liquid and supplies the cleaning liquid to the substrate surface Wf. As a result, the liquid film LF of the cleaning liquid is formed on the substrate surface Wf (liquid film forming operation). The revolution speed of the substrate W is adjusted at this stage, thereby adjusting the film thickness of the liquid film LF at a high accuracy. For instance, as the revolution speed of the substrate W is set to 100 rpm and the nozzle 41 feeds DIW as the cleaning liquid to the substrate surface Wf at the flow rate of 300 (mL/min), the liquid film LF of the cleaning liquid is formed to 2 through 3 mm on the substrate surface Wf. According to the first embodiment, the liquid film LF consisting only of the liquid film segment LF1 is formed on the substrate surface Wf, and such a liquid film LF covers the substrate surface Wf from above.

After the liquid film has been formed, the ultrasonic wave applying head 71 moves from the retracted position P0 to the vibration applying position P1 and gets positioned at the vibration applying position P1. This brings the vibration surface VF into contact with the liquid film LF. Following this, the ultrasonic oscillator 714 outputs a pulse signal to the transducer 713 and the transducer 713 starts ultrasonic vibration. Ultrasonic vibration is thus applied upon the liquid film LF at the vibration applying position (which is a peripheral section of the front surface of the substrate W) P1. In this embodiment, while applying wave-generating vibration which will be described next, the ultrasonic wave applying head 71 is fixed at the vibration applying position P1, and the oscillation output is set to 5 W and the oscillating frequency is set to 3 MHz during the application.

Further, in this embodiment, the cleaning liquid falls in drops from the nozzle 41 onto the liquid film LF to apply wave-generating vibration thereto in addition to the ultrasonic vibration. In other words, the control unit 2 controls the flow rate adjuster 42, thereby adjusting the flow rate for supplying the cleaning liquid at the nozzle 41, and controls the nozzle ascend/descend drive mechanism 52, thereby adjusting the height position of the nozzle 41. With these two control factors (namely, the flow rate for supplying the cleaning liquid and the nozzle height H) thus adjusted, drops of the cleaning liquid are fed upon the liquid film LF at the rotation center of the substrate W (drop supplying operation).

In this fashion, while ultrasonic vibration is being applied upon the liquid film LF which is on the substrate surface Wf at the vibration applying position P1, drops of the cleaning liquid are supplied to the liquid film LF at the drop arrival position P2 which is different from the vibration applying position P1 and wave-generating vibration which is different from ultrasonic vibration is consequently applied upon the liquid film LF. As compared with mere application of ultrasonic vibration therefore, removal ratio of particles adhering to the substrate surface Wf is far better. The effect of this is as represented by the experimental result above. Utilizing this effect, it is possible to effectively remove particles owing to wave-generating vibration and favorably clean the substrate surface Wf even when the output of ultrasonic vibration, the frequency and the like are set only to such an extent not damaging the substrate W.

After the substrate surface Wf has been cleaned in the manner above, the supply of the cleaning liquid to the nozzle 41 is stopped and the ultrasonic vibration is stopped. Further, the revolution speed of the substrate W is increased, whereby centrifugal force acts upon the cleaning liquid which remains on the substrate W and the cleaning liquid is removed off from the substrate W, and the substrate W is dried (spin drying). Upon completion of the series of processing, the transportation unit unloads the processed substrate W from the substrate cleaning apparatus.

As described above, according to this embodiment which adds application of wave-generating vibration, the particle removal ratio can be improved since wave-generating vibration is additionally applied besides application of ultrasonic vibration upon the liquid film LF which is on the substrate W such as a silicon wafer. Hence, although mere application of ultrasonic vibration at the oscillation output and the frequency described above would not achieve excellent removal of particles while suppressing damage, addition of wave-generating vibration would improve the particle removal ratio. In short, it is possible to attain both suppression of damage upon the substrate and improvement of particle removal.

Further, in the embodiment above, the vibration applying position P1 is provided in a peripheral section of the front surface of the substrate W. Since the surface peripheral section is usually a section where a pattern or the like would not be formed, the ultrasonic vibration propagating through the liquid film LF and reaching the substrate W mostly concentrates on a section on which a pattern is not formed. It is therefore possible to effectively prevent the ultrasonic vibration from damaging the pattern.

Further, application of wave-generating vibration would make the area of excellent removal uneven. However, the drop arrival position P2 is set to the rotation center of the substrate W and the cleaning processing is performed while the substrate W rotates one round or more in this embodiment. Hence, it is possible to evenly and favorably remove particles from the entire substrate surface Wf.

In the above first embodiment, although the drop arrival position P2 is set to the rotation center of the substrate W, the drop arrival position P2 is not limited to this. When the drop arrival position P2 is set to a different position from the vibration applying position P1 and wave-generating vibration is applied to the liquid film LF at this position, it is possible to efficiently remove particles which are on the substrate surface Wf while suppressing damage upon the substrate W. Further, when the drop arrival position P2 is located at a position nearer to the rotation center of the substrate W than the vibration applying position P1, it is possible to uniformly remove particles from the entire substrate surface Wf.

Second Embodiment

In the substrate cleaning apparatus according to the above first embodiment, the ultrasonic wave applying head 71 is positioned at the vibration applying position P1 which is in the liquid film segment (which will be hereinafter referred to as the "substrate-side liquid film segment") LF1 which is formed on the substrate surface Wf and applies ultrasonic vibration. However, the liquid film segment may be formed outside the periphery of the substrate W and ultrasonic vibration may be applied to this outer-side liquid film segment as described below. A second embodiment will now be described with reference to FIGS. 5A, 5B, 10 and 11.

Figure 10:
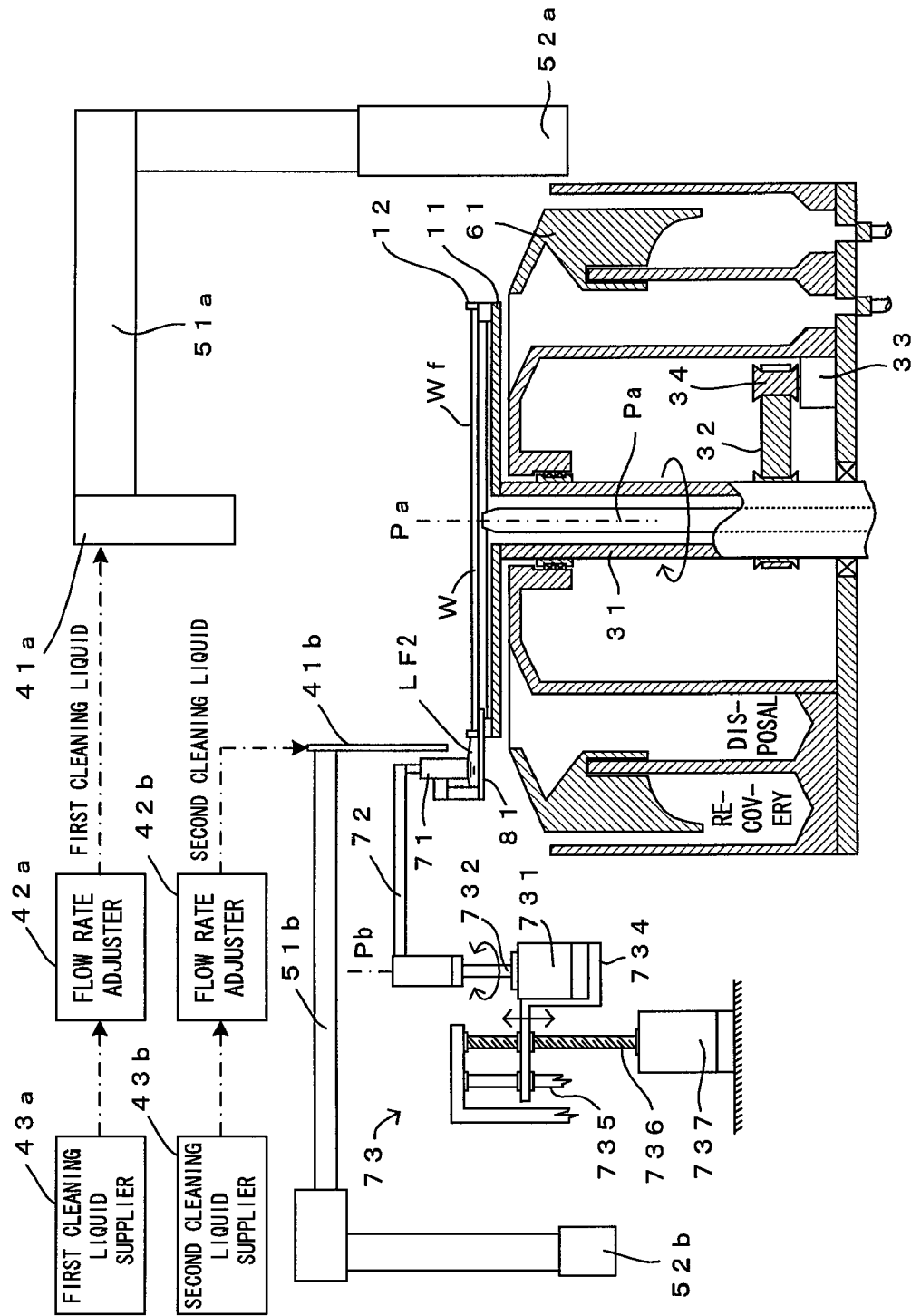
FIG. 10 is a diagram showing a second embodiment of a substrate cleaning apparatus according to the invention.
Figure 11:
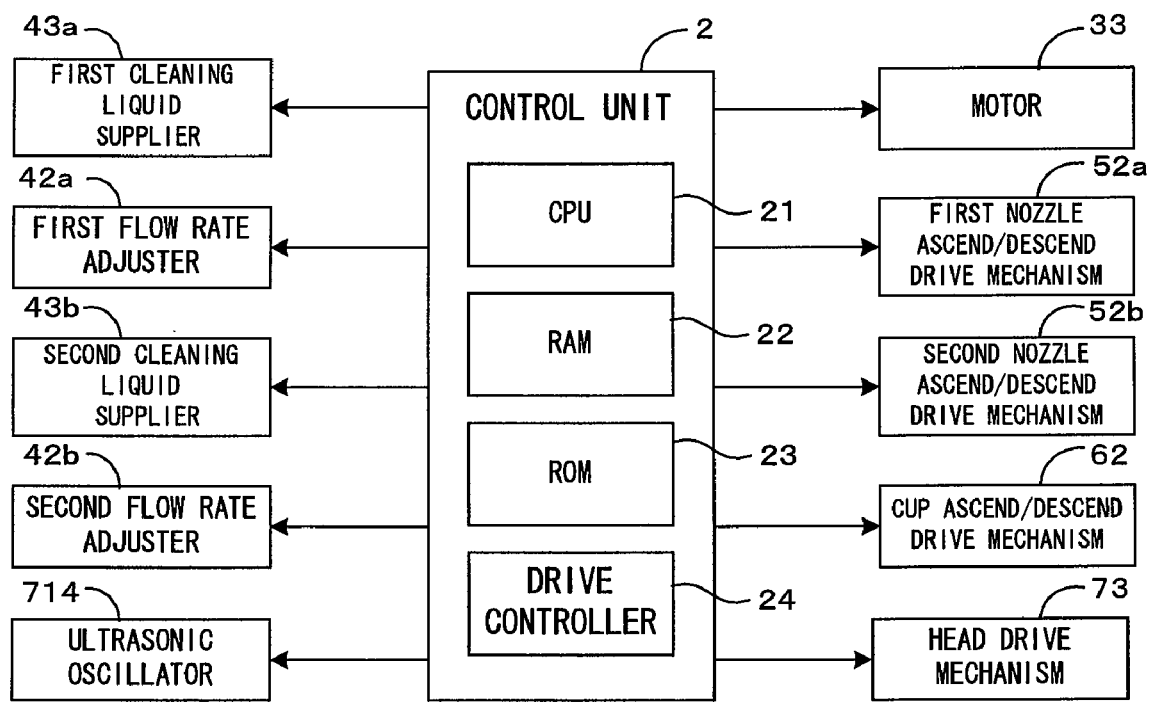
FIG. 11 is a block diagram which shows the electric structure of the substrate cleaning apparatus which is shown in FIG. 10.

FIG. 10 is a diagram showing a second embodiment of a substrate cleaning apparatus according to the invention. FIG. 11 is a block diagram which shows the electric structure of the substrate cleaning apparatus which is shown in FIG. 10. The second embodiment is widely different from the first embodiment in that an introducing unit 8 for forming the outer-side liquid film segment is provided, a first cleaning liquid and a second cleaning liquid are discharged from different nozzles 41a and 41b, and the vibration applying position P1 and the drop arrival position P2 are located in the outer-side liquid film segment. The second embodiment is otherwise basically the same as the first embodiment in terms of structure and operation. Noting this, the differences will be described mainly, and the same structures as those according to the first embodiment will not be described but denoted at the same or corresponding reference symbols.

The supply unit 4 according to the second embodiment comprises the two types of nozzles 41a, 41b. The nozzle 41a is located on the rotation center Pa and above the spin base 11 as in the first embodiment. A first cleaning liquid supplier 43a is connected to the nozzle 41a via a first flow rate adjuster 42a, so that the first cleaning liquid is supplied onto the center of rotation on the substrate surface Wf. When the first cleaning liquid supplier 43a and the first flow rate adjuster 42a operate in accordance with a command received from the control unit 2, the first nozzle 41a supplies the first cleaning liquid to a central part of the substrate surface Wf. At this stage, with the revolution speed of the substrate W adjusted, the film thickness of the liquid film LF is adjusted at a high accuracy. In the second embodiment, a plate 81 of the introducing unit 8 can be disposed approximately parallel to the substrate surface Wf in the vicinity of a peripheral section of the substrate W as described below, so that it is possible to form the outer-side liquid film segment LF2 on the plate 81 with the first cleaning liquid which flows over to the surface of the plate 81 of the introducing unit 8 from the substrate surface Wf.

As shown in FIGS. 5A, 5B and 10, the introducing unit 8 comprises the plate 81 which can be disposed approximately parallel to the major surface of the substrate W in the vicinity of a peripheral section of the substrate W, and a side plate 82 which fixes the plate 81 to the ultrasonic wave applying head 71. That is, in this embodiment, the plate 81 is connected on its one side (the left-hand side in FIGS. 5A and 5B) as if it were a cantilever with the ultrasonic wave applying head 71 by the side plate 82. The other side (the right-hand side in FIGS. 5A and 5B) of the plate 81 is therefore a free-end which extends toward the substrate. When the head drive mechanism 73 operates in accordance with an operation command received from the control unit 2 and the ultrasonic wave applying head 71 accordingly moves to the predetermined vibration applying position P1, the plate 81 moves to the vicinity of a peripheral section of the substrate W and gets positioned there. The plate 81 is made of a more hydrophilic material (which may be quartz for instance) than the front surface Wf of the substrate W which needs be cleaned. When the head drive mechanism 73 sets the plate 81 close to the peripheral section of the substrate W, a peripheral section within the substrate surface Wf partially overlaps the free end of the plate 81 as viewed from above as shown in FIGS. 5A and 5B, and owing to a surface tension difference, the first cleaning liquid supplied to the substrate surface Wf from the nozzle 41a moves from the substrate W to the plate 81. The outer-side liquid film segment LF2 which is contiguous to the substrate-side liquid film segment LF1 is consequently formed on the plate 81, and the liquid film LF formed by the substrate-side liquid film segment LF1 and the outer-side liquid film segment LF2 covers the substrate surface Wf from above.

In this embodiment, when the plate 81 is positioned at its cleaning position (which is in the vicinity of the peripheral section of the substrate W), the plate 81 is positioned in proximity to a peripheral edge section and the bottom surface of the substrate W to such an extent permitting the substrate-side liquid film segment LF1 to be contiguous to the outer-side liquid film segment LF2. Hence, when the other nozzle 41b supplies the second cleaning liquid and applies wave-generating vibration to the liquid film LF, the substrate W is protected against contact with the plate 81 and associated damage.

A second cleaning liquid supplier 43b is connected to the second nozzle 41a via a second flow rate adjuster 42b, so that the second cleaning liquid can be supplied to the outer-side liquid film segment LF2. Meanwhile, in the second embodiment, the drop arrival position P2 is set such that the vibration applying position P1 is on the opposite side of the drop arrival position P2 from the substrate-side liquid film segment LF1 and such that the rotation center of the substrate W, the drop arrival position P2 and the vibration applying position P1 are in alignment with each other (that is, on the dashed-dotted line in FIG. 5B). When the second flow rate adjuster 42b operates in accordance with a control signal from the control unit 2 while the second cleaning liquid supplier 43b is in operation, supply of the second cleaning liquid to the nozzle 41b from the second cleaning liquid supplier 43b is adjusted.

A horizontal beam 51b links the top end of the second nozzle 41b to a second nozzle ascend/descend drive mechanism 52b. When the second nozzle ascend/descend drive mechanism 52b operates in accordance with a control signal from the control unit 2, the nozzle 41b moves upward and downward together with the horizontal beam 51b as one integrated unit. Hence, when the control unit 2 provides the second nozzle ascend/descend drive mechanism 52 with a height-position command related to the height position of the nozzle 41b measured from the substrate surface Wf, the nozzle 41b moves up or down and gets positioned at a height position which corresponds to the height-position command. Adjustment of the height H from the substrate surface Wf to the tip (outlet) of the nozzle 41b therefore controls the second cleaning liquid discharged from the nozzle 41b so that the second cleaning liquid reaches the outer-side liquid film segment LF2 as a column of liquid or as drops.

Operations of the substrate cleaning apparatus having the above structure according to the second embodiment will now be described. In this substrate cleaning apparatus, the substrate W not processed yet is transported by the transportation unit not shown to above the support pins 12 and then held by the support pins 12. After the transportation unit has moved back from the substrate cleaning apparatus, the CPU 21 of the control unit 2 controls the respective parts of the apparatus, whereby the cleaning operation is performed. At this stage, the ultrasonic wave applying head 71 is at the retracted position P0.

First, the substrate W starts rotating. The nozzle 41a thereafter discharges the first cleaning liquid as a column of liquid and supplies the first cleaning liquid to the substrate surface Wf. As a result, the liquid film LF of the cleaning liquid is formed on the substrate surface Wf (liquid film forming operation). The revolution speed of the substrate W is adjusted at this stage as in the first embodiment, thereby adjusting the film thickness of the liquid film LF at a high accuracy.

After the liquid film has been formed, the substrate W stops rotating. The height position of the splashing preventing cup 61 is set to a downward position, and the plate 81 and the ultrasonic wave applying head 71 swing toward the vibration applying position P1 (which is the position shown in FIGS. 5A, 5B and 10) from the retracted position P0 and are positioned near an outer peripheral section of the substrate W. At this stage, the free-end side (the right-hand side in FIGS. 5A and 5B) of the plate 81, namely, the opposite side to the side of the plate 81 which is connected with the ultrasonic wave applying head 71 by the side plate 82, moves toward the bottom surface of the substrate W. An end section in the top surface of the plate 81 is then positioned opposed to and in the vicinity of a peripheral section in the bottom surface of substrate W. This causes a most area of the top surface of the plate 81 to be positioned parallel with a peripheral edge section of the substrate W in a radial direction AR1 and not to be covered by the substrate W.

As a result, the first cleaning liquid bulging on the substrate W is partially introduced onto the plate 81 because of the surface tension. The outer-side liquid film segment LF2 is consequently formed on the plate 81. In this way, in the second embodiment, the first cleaning liquid supplied to the substrate surface Wf forms the substrate-side liquid film segment LF1 on the substrate surface Wf, and further, when introduced onto the plate 81 from the substrate W, the first cleaning liquid forms the outer-side liquid film segment LF2 which is contiguous to the substrate-side liquid film segment LF1. In this fashion, the liquid film LF formed by the substrate-side liquid film segment LF1 and the outer-side liquid film segment LF2 covers the substrate surface Wf, and the vibration surface VF of the vibration plate 712 contacts the outer-side liquid film segment LF2.

In addition, the nozzle 41b driven by the nozzle ascend/descend drive mechanism 52b swings toward the drop arrival position (second position) P2 from the retracted position, in parallel with the swinging action of the plate 81 and the ultrasonic wave applying head 71. However, the swinging action of the nozzle 41b is not limited to this timing. The nozzle 41b may start swinging after the end of the swinging action of the plate 81 and the ultrasonic wave applying head 71. Alternatively, after the end of the swinging action of the nozzle 41b, the swinging action of the plate 81 and the ultrasonic wave applying head 71 may start. The timing at which the nozzle 41b swings remains similar in a third embodiment described later as well.

In the case where the plate 81 and the ultrasonic wave applying head 71 are positioned in the vicinity of a peripheral section of the substrate W as shown in FIGS. 5A, 5B and 10, the vibration plate 712 of the ultrasonic wave applying head 71 is positioned on the far side in the radial direction AR1 of the substrate W as viewed from the nozzle 41b.

The control unit 2 then makes the second cleaning liquid supplier 43b supply the second cleaning liquid to the outer-side liquid film segment LF2 such that vibration (wave-generating vibration) different from ultrasonic vibration is applied to the drop arrival position P2 which is in the outer-side liquid film segment LF2, while activating the ultrasonic wave applier unit 70 such that ultrasonic vibration is applied to the vibration applying position P1 which is in the outer-side liquid film segment LF2. More specifically, a flow rate adjusting valve 42b is opened, and the second cleaning liquid is supplied to the drop arrival position P2 which is in the outer-side liquid film segment LF2. In parallel with the supply of the second cleaning liquid, the ultrasonic oscillator 714 outputs a pulse signal to the transducer 713 and the ultrasonic vibration is supplied to the vibration applying position P1 which is in the outer-side liquid film segment LF2. The vibration applying position P1 is located at a position farther from the substrate W than the drop arrival position P2 at which the second cleaning liquid is supplied from the second cleaning liquid supplier 43b. Further, the rotation center of the substrate W, the drop arrival position P2 and the vibration applying position P1 are in alignment with each other (that is, on the dashed-dotted line in FIG. 5B).

In this way, in the second embodiment, it is possible excellently to apply wave-generating vibration to the outer-side liquid film segment LF2 by putting drops of the second cleaning liquid onto the outer-side liquid film segment LF2. Further, ultrasonic vibration is applied to the outer-side liquid film segment LF2 and the second cleaning liquid is supplied to the outer-side liquid film segment LF2 during the cleaning process. Hence, it is possible to dramatically enhance the removal ratio of removing particles adhering to the substrate W while reducing damage upon the substrate W caused by application of ultrasonic vibration and supply of the second cleaning liquid.

Further, it is possible to favorably remove particles from the substrate W by using ultrasonic vibration and wave-generating vibration together even when, in the case where application of ultrasonic vibration alone is performed, the output range and the oscillation frequency range of ultrasonic vibration are within the range that does not damage the substrate W, whereas that does not favorably remove particles on the substrate W. This makes it possible to reduce damage upon wiring patterns formed on the substrate W while improving the removal ratio of removing particles adhering to the substrate W as compared with cleaning with application of ultrasonic vibration alone to the outer-side liquid film segment LF2.

Furthermore, the second cleaning liquid supplier 43b is capable of supplying the second cleaning liquid from one nozzle 41b toward the outer-side liquid film segment LF2 at a position outside the substrate W as shown in FIGS. 5A, 5B and 10. This makes it possible to minimize the range within which the second cleaning liquid discharged from the nozzle 41b collides with the outer-side liquid film segment LF2. Hence, it is possible to reduce the influence that may lead to damage upon the substrate W.

In this embodiment, the oscillation output and the oscillation frequency of ultrasonic vibration applied by the ultrasonic wave applying head 71 are set from 1 W to 10 W (preferably, from 3 W to 6 W) and from 1 MHz to 6 MHz (preferably, from 2 MHz to 3 MHz), respectively. This makes it possible to prevent the substrate W and wiring patterns and the like formed on the substrate W from suffering damage caused by ultrasonic vibration.

When the particle removal is completed as described above, the second flow rate adjuster 42b is closed, thereby stopping supply of drops of the second cleaning liquid, and the ultrasonic wave applying head 71 stops supplying ultrasonic vibration. The ultrasonic wave applying head 71 then moves back, and the substrate W rotates at a high speed. As a result, the first and the second cleaning liquids adhering to the substrate W are shaken off due to centrifugal force and the substrate is dried (spin drying), which completes the cleaning processing. After the series of processing, the transportation unit unloads the processed substrate W from the substrate cleaning apparatus.

As described above, according to the second embodiment, wave-generating vibration is additionally applied in addition to application of ultrasonic vibration to the liquid film LF which is on the substrate W such as a silicon wafer. Hence, it is possible to improve the particle removal ratio as in the first embodiment. Further, in the second embodiment, the vibration applying position P1 is set within the outer-side liquid film segment LF2. Hence, ultrasonic vibration outputted from the ultrasonic wave applying head 71 propagates to the substrate-side liquid film segment LF1 via the outer-side liquid film segment LF2. Therefore, it is possible to effectively prevent the substrate surface Wf from suffering damage caused by the ultrasonic vibration. In addition, in the second embodiment, the wave-generating vibration is applied to the position P2 which is on the way from the vibration applying position P1 in the outer-side liquid film segment LF2 toward the substrate-side liquid film segment LF1 and the substrate surface Wf that the ultrasonic vibration propagates. Hence, it is possible to remove particles at an excellent removal ratio all over the substrate surface Wf. That is, it is possible to even more efficiently remove particles which are on the substrate surface Wf while suppressing damage upon the substrate W.

Third Embodiment

While the substrate cleaning apparatus according to the second embodiment applies both ultrasonic vibration and wave-generating vibration to the outer-side liquid film segment LF2, an alternative structure may be that wave-generating vibration is applied to the substrate-side liquid film segment LF1 as shown in FIGS. 6A and 6B for example. A third embodiment will now be described with reference to FIGS. 6A and 6B. The basic structure of the apparatus is the same as that according to the second embodiment, and hence, the structure will not be described.

According to the third embodiment, the nozzle 41a supplies the first cleaning liquid to the substrate surface Wf and the liquid film LF including the substrate-side liquid film segment LF1 and the outer-side liquid film segment LF2 is formed as in the second embodiment. In parallel with the swinging action of the plate 81 and the ultrasonic wave applying head 71, the nozzle 41b driven by the nozzle ascend/descend drive mechanism 52b swings from its retracted position toward the drop arrival position (second position) P2 which is in the substrate-side liquid film segment LF1. Thus positioned nozzle 41b is located on the substrate side (the right-hand side in FIGS. 6A and 6B) relative to the vibration plate 712 of the ultrasonic wave applying head 71.

The control unit 2 then makes the second cleaning liquid supplier 43b supply the second cleaning liquid to the substrate-side liquid film segment LF1 such that vibration (wave-generating vibration) different from ultrasonic vibration is applied to the drop arrival position P2 which is in the substrate-side liquid film segment LF1, while activating the ultrasonic wave applier unit 70 such that ultrasonic vibration is applied to the vibration applying position P1 which is in the outer-side liquid film segment LF2. Further, in parallel with the supply of the second cleaning liquid, the ultrasonic oscillator 714 outputs a pulse signal to the transducer 713 and the ultrasonic vibration is applied to the vibration applying position P1 which is in the outer-side liquid film segment LF2. The relative positional relationship between the vibration applying position P1 and the drop arrival position P2 is similar to that in the second embodiment. That is, the vibration applying position P1 is located at a position farther from the substrate W than the drop arrival position P2 at which the second cleaning liquid is supplied from the second cleaning liquid supplier 43b. Furthermore, the rotation center of the substrate W, the drop arrival position P2 and the vibration applying position P1 are in alignment with each other in this order (that is, on the dashed-dotted line in FIG. 6B).

As described above, according to the third embodiment as well, it is possible to reduce damage upon the substrate W caused by the applied ultrasonic vibration during the cleaning processing since the ultrasonic vibration is applied to the outer-side liquid film segment LF2, which is similar to the second embodiment. In addition, the substrate-side liquid film segment LF1 receives both ultrasonic vibration and wave-generating vibration by supplying the second cleaning liquid in drops to the substrate-side liquid film segment LF1. As a result, it is possible to dramatically enhance the removal ratio of removing particles adhering to the substrate W as indicated by the experimental result described earlier.

Further, in the third embodiment, the second cleaning liquid is supplied to a position corresponding to a peripheral section of the substrate surface Wf within the substrate-side liquid film segment LF1, and accordingly, wave-generating vibration is applied as shown in FIGS. 6A and 6B. That is, the drop arrival position P2 is provided in a surface peripheral section of the substrate W. Since the surface peripheral section is usually a section on which a pattern or the like would not be formed, wave-generating vibration which is generated when the second cleaning liquid is supplied to the liquid film LF mostly concentrates on a non-pattern-formed section. It is therefore possible to effectively prevent the wave-generating vibration from damaging the pattern. In addition, the drop arrival position P2 is set at the closest position to the vibration applying position P1 within the substrate-side liquid film segment LF1 as clearly shown in FIGS. 6A and 6B. Hence, an area of excellent removal spreads all over the substrate surface Wf except for a non-pattern-formed section, thereby uniformly removing particles from the entire substrate surface Wf.

Others

Figure 12:
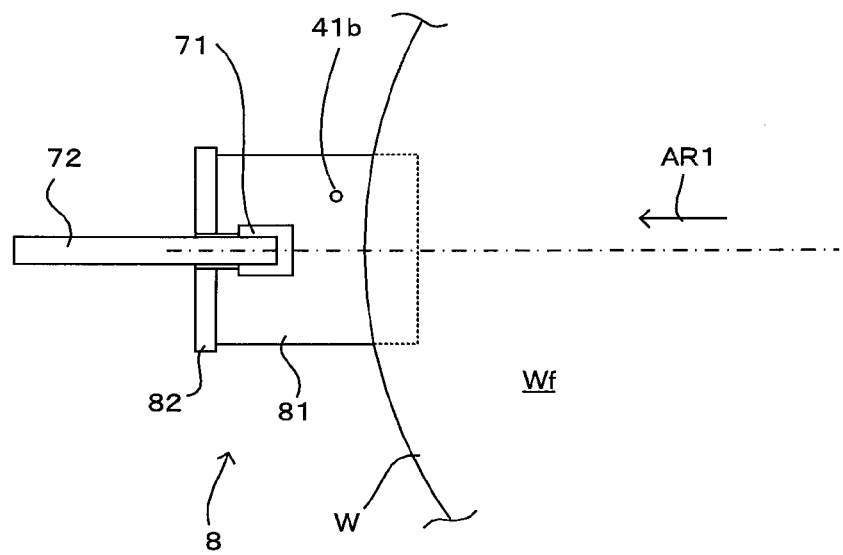
FIG. 12 is a diagram showing a relationship between a vibration applying position and a drop arrival position in a modification.
Figure 13:
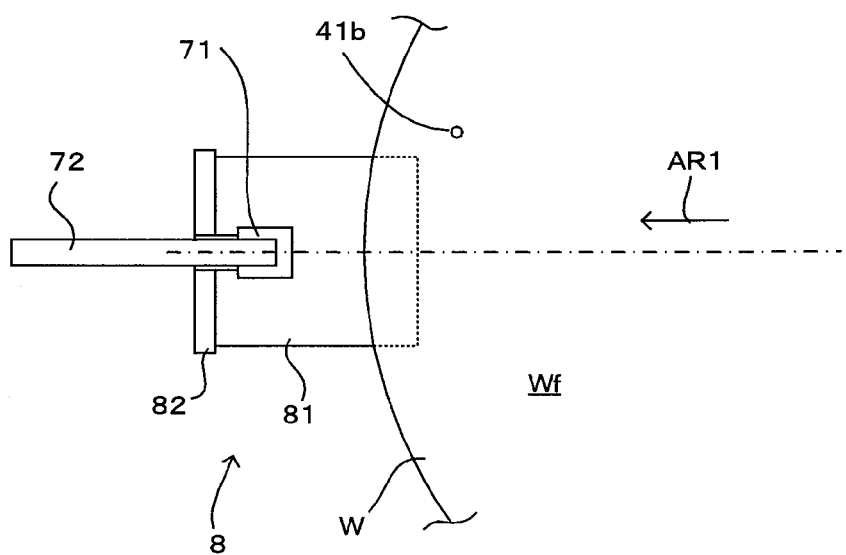
FIG. 13 is a diagram showing a relationship between a vibration applying position and a drop arrival position in another modification.

The present invention is not limited to the preferred embodiments above, but may be modified in various manners in addition to the preferred embodiments above, to the extent not deviating from the object of the invention. For instance, in the second and the third embodiments described above, the vibration applying position P1 and the drop arrival position P2 are set such that the rotation center of the substrate W, the drop arrival position P2 and the vibration applying position P1 are in alignment with each other (that is, on the dashed-dotted lines in FIGS. 5B and 6B). However, the relative positional relationship between the vibration applying position P1 and the drop arrival position P2 is not limited to this. More specifically, the drop arrival position (second position) P2 may be a position on a path on which the ultrasonic vibration propagates within the liquid film LF toward the substrate surface Wf and different from the vibration applying position (first position) P1 which receives ultrasonic vibration. For instance, the drop arrival position P2 may be located at a position which is off the linear line which connects the vibration applying position P1 with the rotation center of the substrate W as shown in FIGS. 12 and 13.

Further, in the second and the third embodiments, the description has been made that the first cleaning liquid from the nozzle 41a is supplied to the substrate surface Wf for forming the liquid film on the substrate surface Wf and the second cleaning liquid from the nozzle 41b is supplied to the plate 81 for applying wave-generating vibration. However, the method of supplying the first and the second cleaning liquids is not limited to this. In the case where the first and the second cleaning liquids are cleaning liquids of the same type for example, the cleaning liquids may be fed from one nozzle. In such an instance, the nozzle may move to above the rotation center of the substrate W to form the substrate-side liquid film segment LF1 but to above the drop arrival position P2 to apply wave-generating vibration.

Further, in the second and the third embodiments, the description has been made that the head drive mechanism 73 drives the plate 81 and the nozzle 41b which is capable of discharging the second cleaning liquid can swing, ascend and descend when driven by the nozzle ascend/descend drive mechanism 52b. However, the method of swinging the plate 81 and the nozzle 41b and moving them upward and downward is not limited to this. For example, the nozzle 41b may be attached to the ultrasonic wave applying head 71 like the plate 81. In such an instance, a common mechanism attains swinging and ascending/descending. This reduces the number of parts and components to use, and hence, the footprint of the substrate cleaning apparatus.

Further, in the second and the third embodiments, although the ultrasonic wave applying head 71 and the plate 81 are structured so that they can move together as one integrated unit, they may be structured so that they can move independently of each other. In such an instance, it is possible to set the height position of the plate 81 and that of the ultrasonic wave applying head 71 independently of each other, which enhances the position accuracy of each part. In addition, it is possible to deal with various types of recipes, and hence, the versatility improves.

Further, in the second and the third embodiments, the description has been made that the substrate W is held at the spin base 11 by means of the support pins 12, but this is not limiting. For example, a suction chuck smaller than the substrate W may suck and hold the substrate W. In this case, with the plate 81 set, the substrate W may be rotated by rotation of the chuck during cleaning of the substrate W. More particularly, when the cleaning time is 60 seconds, the substrate may be rotated at least once (1 rpm). This ensures uniform cleaning of the entire surface of the substrate W. In addition, even in a structure as that according to the second and the third embodiments that the support pins 12 hold the substrate W, the substrate W may be rotated while controlling the plate 81 such that the plate 81 moves back at a position where the plate 81 abuts on the support pins 12 but moves forward when the support pins 12 move passed this position with the rotation of the spin base 11 during the cleaning processing.

Further, although the second and the third embodiments use one ultrasonic wave applying head 71, more than one ultrasonic wave applying heads 71 may be disposed in the vicinity of a peripheral edge section of the substrate W as shown in FIG. 14 for example. In this embodiment, in an apparatus for cleaning the substrate W which is held by three support pins 12, three introduction plates 81 and three ultrasonic wave applying heads 71 are disposed between the support pins 12 which are adjacent to each other in the circumferential direction of the substrate W. Further, the ultrasonic wave applying heads 71 are disposed equidistant from each other (at angular intervals R1 of approximately 120 degrees) along the circumference of the substrate W. This ensures uniform cleaning of the entire surface of the substrate W.

Further, although the first and the second cleaning liquids are both DIW (processing liquids of the same type) in the first through the third embodiments, this is not limiting. For example, the first and the second cleaning liquids may be chemical solutions such as SC1 solution (ammonia-hydrogen peroxide mixture) which are used for wafer cleaning. Alternatively, the first and the second cleaning liquids may be different processing liquids.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate cleaning apparatus, comprising:
an ultrasonic wave applier which applies ultrasonic vibration to a liquid film at a first position on a substrate, the liquid film being made of a first cleaning liquid and covering at least a surface of the substrate;

a supplier which supplies a second cleaning liquid in the form of drops to the liquid film at a second position on the substrate, which is on a path in which the ultrasonic vibration propagates within the liquid film, and which is different from the first position; and a controller which causes the supplier to supply the second cleaning liquid drops to the liquid film, so as to apply an additional vibration different from the ultrasonic vibration to the liquid film, while activating the ultrasonic wave applier to apply the ultrasonic vibration to the liquid film, wherein a relative positional relationship between the first position and the second position is adjusted so that the liquid film covers a substrate surface area which is on the opposite side of the second position from the first position.

2. The substrate cleaning apparatus of claim 1, wherein the liquid film includes a substrate-side liquid film segment which is formed on the surface of the substrate by supplying the first cleaning liquid to the surface of the substrate, and wherein the first and the second positions are both located in the substrate-side liquid film segment.

3. The substrate cleaning apparatus of claim 1, further comprising a substrate rotating device which rotates the substrate, wherein the controller applies the ultrasonic vibration and the additional vibration upon the liquid film while the substrate rotates one round or more.

4. The substrate cleaning apparatus of claim 3, wherein the second position is located closer to the rotation center of the substrate than the first position.

5. The substrate cleaning apparatus of claim 4, wherein the second position is located at the rotation center of the substrate.

6. The substrate cleaning apparatus of claim 1, further comprising a plate which is structured to be positioned approximately parallel to the surface of the substrate in the vicinity of a peripheral edge section of the substrate, wherein the liquid film includes a substrate-side liquid film segment and an outer-side liquid film segment, the substrate-side liquid film segment being formed on the surface of the substrate by the first cleaning liquid which is supplied to the surface of the substrate, the outer-side liquid film segment being formed on the surface of the plate by the first cleaning liquid which flows over to the surface of the plate from the surface of the substrate, wherein the first and the second positions are both located in the outer-side liquid film segment, and wherein the first position is located on an opposite side of the second position from the substrate-side liquid film segment.

7. The substrate cleaning apparatus of claim 6, further comprising a substrate rotating device which rotates the substrate, wherein the rotation center of the substrate, the second position and the first position are aligned with each other on a straight line in an order of the rotation center of the substrate, the second position and the first position.

8. The substrate cleaning apparatus of claim 1, further comprising a plate which is structured to be positioned approximately parallel to the surface of the substrate in the vicinity of a peripheral edge section of the substrate, wherein the liquid film includes a substrate-side liquid film segment and an outer-side liquid film segment, the substrate-side liquid film segment being formed on the surface of the substrate by the first cleaning liquid which is supplied to the surface of the substrate, the outer-side liquid film segment being formed on the surface of the plate by the first cleaning liquid which flows over to the surface of the plate from the surface of the substrate, wherein the first position is located in the outer-side liquid film segment, and wherein the second position is located in the substrate-side liquid film segment.

9. The substrate cleaning apparatus of claim 8, further comprising a substrate rotating device which rotates the substrate, wherein the rotation center of the substrate, the second position and the first position are aligned with each other on a straight line in an order of the rotation center of the substrate, the second position and the first position.

10. The substrate cleaning apparatus of claim 1, wherein the supplier includes a nozzle which discharges the second cleaning liquid drops.

11. The substrate cleaning apparatus of claim 10, wherein the supplier supplies the first cleaning liquid from the nozzle to the surface of the substrate, thereby forming the liquid film.

12. The substrate cleaning apparatus of claim 10, wherein the supplier further includes a different nozzle different from the nozzle and supplies the first cleaning liquid to the surface of the substrate from the different nozzle, thereby forming the liquid film.

13. The substrate cleaning apparatus of claim 1, wherein the first cleaning liquid and the second cleaning liquid are processing liquids of the same type.

14. A substrate cleaning apparatus, comprising:

an introducing unit which is disposed in the vicinity of a peripheral edge section of the substrate on a surface of which a substrate-side liquid film segment of a first cleaning liquid is formed, and forms an outer-side liquid film segment which is contiguous to the substrate-side liquid film segment with the first cleaning liquid introduced from the substrate-side liquid film segment to the outer side of the substrate;

an ultrasonic wave applier which applies ultrasonic vibration upon the outer-side liquid film segment;

a supplier which supplies a second cleaning liquid to the outer-side liquid film segment at a position closer to the substrate than a position at which the ultrasonic vibration is applied; and a controller which causes the supplier to supply the second cleaning liquid to the outer-side liquid film segment to apply additional vibration different from the ultrasonic vibration upon the outer-side liquid film segment while activating the ultrasonic wave applier to apply the ultrasonic vibration upon the outer-side liquid film segment.

15. The substrate cleaning apparatus of claim 14, wherein the introducing unit includes a plate which is structured to be positioned approximately parallel to the surface of the substrate in the vicinity of a peripheral edge section of the substrate, and forms the outer-side liquid film segment with the first cleaning liquid introduced onto the plate from the substrate-side liquid film segment.

16. The substrate cleaning apparatus of claim 14, wherein the supplier includes a nozzle which discharges the second cleaning liquid, and wherein the controller controls the supplier so that the second cleaning liquid discharged from the nozzle reaches the liquid film in a shape of drops and accordingly applies the additional vibration upon the liquid film.

\* \* \* \* \*